(12) United States Patent
Xie et al.

(10) Patent No.: US 10,950,428 B1
(45) Date of Patent: Mar. 16, 2021

(54) METHOD FOR PROCESSING A WORKPIECE

(71) Applicants: Mattson Technology, Inc., Fremont, CA (US); Beijing E-Town Semiconductor Technology Co., Ltd., Beijing (CN)

(72) Inventors: Ting Xie, Fremont, CA (US); Hua Chung, Saratoga, CA (US); Xinliang Lu, Fremont, CA (US); Shawming Ma, Sunnyvale, CA (US); Michael X. Yang, Palo Alto, CA (US)

(73) Assignees: Mattson Technology, Inc., Fremont, CA (US); Beijing E-Town Semiconductor Technology Co., Ltd., Beijing (CN)

( * ) Notice: Subject to any disclaimer, the term of this patent is extended or adjusted under 35 U.S.C. 154(b) by 0 days.

(21) Appl. No.: 16/556,938

(22) Filed: Aug. 30, 2019

(51) Int. Cl.
H01L 21/02 (2006.01)
H01J 37/32 (2006.01)
C23C 8/24 (2006.01)
C23C 8/36 (2006.01)

(52) U.S. Cl.
CPC .......... *H01L 21/02247* (2013.01); *C23C 8/24* (2013.01); *C23C 8/36* (2013.01); *H01J 37/321* (2013.01); *H01J 37/32091* (2013.01); *H01J 37/32541* (2013.01); *H01J 37/32651* (2013.01); *H01J 37/32715* (2013.01); *H01L 21/0217* (2013.01); *H01J 2237/332* (2013.01); *H01L 21/02252* (2013.01)

(58) Field of Classification Search
CPC ............ H01L 21/02247; H01L 21/0217; H01J 37/321; H01J 37/32091; H01J 37/32651; H01J 37/32715; H01J 37/32541; H01J 2237/332; C23C 8/36; C23C 8/24
See application file for complete search history.

(56) References Cited

U.S. PATENT DOCUMENTS

| | | | |
|---|---|---|---|
| 4,715,937 A | 12/1987 | Moslehi et al. | |
| 5,710,486 A * | 1/1998 | Ye | H01L 37/32082 315/111.21 |
| 6,136,654 A | 10/2000 | Kraft et al. | |
| 7,629,270 B2 | 12/2009 | Swerts et al. | |
| 8,481,433 B2 | 7/2013 | Bevan et al. | |
| 9,054,048 B2 | 6/2015 | Liu et al. | |
| 2008/0083956 A1* | 4/2008 | Mise | H01L 21/28202 257/408 |
| 2011/0120375 A1* | 5/2011 | Song | H01J 37/3244 118/723 E |
| 2012/0247390 A1* | 10/2012 | Sawada | C23C 16/45502 118/723 AN |
| 2013/0313227 A1* | 11/2013 | Katagiri | G21F 9/32 216/55 |

(Continued)

*Primary Examiner* — Jarrett J Stark
(74) *Attorney, Agent, or Firm* — Dority & Manning, P.A.

(57) ABSTRACT

Processes for providing nitridation on a workpiece, such as a semiconductor, are provided. In one example implementation, a method can include supporting a workpiece on a workpiece support. The method can include exposing the workpiece to species generated from a capacitively coupled plasma to provide nitridation on the workpiece. The method can also include exposing the workpiece to species generated form an inductively coupled plasma to provide nitridation on the workpiece.

18 Claims, 6 Drawing Sheets

(56) References Cited

U.S. PATENT DOCUMENTS

| | | | |
|---|---|---|---|
| 2015/0167171 A1* | 6/2015 | Hasebe | C23C 16/511 |
| | | | 427/575 |
| 2017/0330759 A1* | 11/2017 | Gohira | H01L 21/67069 |
| 2018/0166303 A1* | 6/2018 | Tabata | H01L 21/67 |
| 2018/0182652 A1* | 6/2018 | Seshimo | H01L 21/67781 |
| 2018/0330958 A1* | 11/2018 | Kumakura | H01L 21/0337 |
| 2019/0067009 A1* | 2/2019 | Tabata | H01L 21/67069 |
| 2019/0067019 A1* | 2/2019 | Tabata | H01L 21/02274 |
| 2019/0259627 A1* | 8/2019 | Tabata | H05H 1/46 |

* cited by examiner

METHOD FOR PROCESSING A WORKPIECE

FIELD

The present disclosure relates generally to processing a workpiece using a plasma source.

BACKGROUND

Plasma processing is widely used in the semiconductor industry for deposition, etching, resist removal, and related processing of semiconductor wafers and other substrates. Plasma sources (e.g., microwave, ECR, inductive, etc.) are often used for plasma processing to produce high density plasma and reactive species for processing substrates. Post-implantation photoresist, post-etch residue, and other mask and/or material removal have been accomplished using plasma dry strip processes.

Various plasma sources are known for achieving certain plasma process requirements. Multi-frequency capacitively coupled plasma (CCP) sources have been used for independent control of ion energy and plasma density. Inductively coupled plasma (ICP) sources combined with RF bias have also been used, for example, to provide independent control of ion energy and plasma density. ICP sources can easily produce high-density plasma using standard 13.56 MHz and lower frequency RF power generators.

SUMMARY

Aspects and advantages of the invention will be set forth in part in the following description, or may be obvious from the description, or may be learned through practice of the invention.

One exemplary aspect of the present disclosure is directed to a method of processing a workpiece in a plasma processing apparatus. The plasma processing apparatus may include an interior operable to receive a process gas and a workpiece support operable to support a workpiece. The method includes placing the workpiece on the workpiece support in the processing chamber; generating one or more species using a capacitively coupled plasma induced from a first process gas using a capacitively coupled plasma source; and exposing the workpiece to the one or more species generated using the capacitively coupled plasma from the first process gas to provide nitridation on the workpiece.

Aspects of the present disclosure are also directed to a method of processing a workpiece in a plasma processing apparatus. The plasma processing apparatus includes a processing chamber having an interior operable to receive a process gas, a workpiece support operable to support a workpiece, at least one first plasma source disposed over the process chamber interior, and a second plasma source comprising a bias source coupled to a bias electrode in the workpiece support. The method includes placing a workpiece on the workpiece support within the interior of the processing chamber of the processing apparatus; admitting a first process gas into the interior of the processing chamber; energizing the bias source to generate one or more species from a first process gas in the interior of the processing chamber; exposing the workpiece to the one or more species to provide nitridation on the workpiece; admitting a second process gas into the interior of the processing chamber; energizing the first plasma source to generate one or more species from the second process gas in the interior of the processing chamber; and exposing the workpiece to the one or more species to provide nitridation on the workpiece.

Variations and modifications can be made to these exemplary embodiments of the present disclosure.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure, including the best mode, to one of ordinary skill in the art, is set forth more particularly in the remainder of the specification, including reference to the accompanying figures, in which.

DETAILED DESCRIPTION

Figure 1:
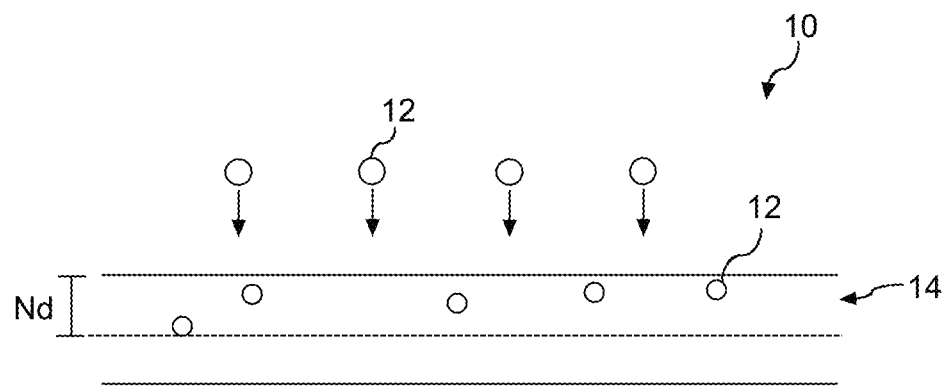
FIG. 1 depicts a workpiece treated according to a workpiece processing method.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Example aspects of the present disclosure are directed to processes for treating a workpiece for forming a nitrogen-containing layer on the workpiece with reduced structure damage caused by plasma nitridation of the workpiece. Briefly, in some embodiments, the use of the method(s) disclosed herein can form a nitrogen-rich layer on a substrate, such as silicon. Further, the method(s) according to example aspects of the present disclosure can allow for control of the thickness and nitrogen concentration of the formed nitridation layer.

Nitridation processes have been employed in the semiconductor manufacturing industry. Nitridation processes may be used, for instance, to enhance the dielectric constant of gate material, to passivate the surface of a workpiece from dopant diffusion, and/or to work as a hardmask for etch processes that may follow. Such diverse applications of nitridation processes may require different amounts of nitrogen to be incorporated into the surface of a workpiece, which is often reflected by the thickness and nitrogen concentration of the formed nitridation layer.

In certain light-dose nitridation methods, (e.g., those resulting in a workpiece having a N % of less than 30%), the method of using plasma can involve generating a high population of nitrogen ions and radicals to react with silicon, thus achieving the nitridation of the surface of a substance. In the case of high-dose nitridation methods, (e.g., those resulting in a workpiece requiring a greater than 40% concentration of nitrogen), ion implantation methods can be used. In ion implantation methods, ions are accelerated to very high speeds before impinging into the substrate. Due to the high kinetic energy, the ions are then able to penetrate more deeply into the bulk of the substrate, resulting in a thicker and higher-dosed nitrogen dopant layer. However, the issue with ion implantation methods is that the substrate or workpiece experiences high film loss and structural damage. Such film loss and structural damage may be due to the sputtering caused by the high-energy ion beam. As device structures continue to grow smaller and smaller, such film loss and structure damage caused by sputtering is not favorable. As an alternative to certain ion implantation methods, plasma nitridation processes may be used, however, the energy of ions and radicals generated by certain plasma processes may not be sufficient to lead to a high-dose nitridation.

Accordingly, provided herein are methods of processing a workpiece using species in a mixed inductive coupled plasma and/or capacitive coupled plasma to enhance ion energy and hence nitridation penetration depth in a workpiece. Indeed, embodiments of the methods provided herein are able to incorporate high-dose nitrogen concentration into the silicon surface of a workpiece. Furthermore, incorporating the use of a capacitively coupled plasma and the use of an additional inductively coupled plasma treatment can increase the nitrogen dose on the workpiece with reduced structural damage to the workpiece. Accordingly, the methods described herein can be used in surface modification or in light doping nitrogen processes to form a nitridation layer as a hardmask or diffusion barrier or can be used to tune the dielectric constant of the insulating layer.

Two factors that may contribute to the nitridation of the resulting workpiece are the nitrogen ion/radical density and the energy of the aforementioned species. Thus, the present methods provide individually controlled RF sources, one on the top of the chamber and one in the bottom of the plasma processing apparatus. The RF source on the top of the chamber works in ICP mode. The ICP mode is efficient in generating nitrogen ion/radical density by transferring the energy via the RF magnetic field through a Faraday shield. The other RF source, i.e. the RF bias source on the bottom of the chamber, is coupled to the plasma in a capacitive way. The capacitive coupled plasma mode induces electrical field which accelerates ions towards the wafer. When operating in CCP mode, the Faraday shield may act as the grounding electrode, which offers a large grounding surface with respect to the workpiece and RF bias electrode. Such a design may induce a much higher bias voltage on the wafer side of the workpiece and thus lead to a higher ion energy, which enables high-dose nitridation on the surface of the workpiece.

Aspects of the present disclosure provide a number of technical effects and benefits. For instance, the present methods provide two individual RF sources that can be controlled individually to adjust nitrogen ion density and the associated energy of certain nitrogen species. For example, in the case of ICP plasma, the nitridation efficiency is low although ICP plasma shows reduced structure damage due to the low ion energy. To increase nitridation efficiency, a CCP power is required to be superimposed to the ICP plasma in order to enhance the ion energy. However, it was noticed that the use of ICP and CCP plasma at the same time can lead to severe damage on the workpiece, which can compromise the enhancement in the nitridation efficiency. To avoid such issues, the methods according to example aspects of the present disclosure demonstrate that a CCP plasma only process may be a viable approach to improve nitridation of the workpiece and reduce damage. Furthermore, the use of a CCP and ICP two-step process (e.g., a CCP process followed by an ICP process), may further increase the total thickness of the nitridation layer without introducing significant structural damage to the workpiece. Furthermore, the use of fluorine gas during the nitridation process (e.g. an ICP process) can also enhance the efficiency in forming a high-dose nitrogen layer on the workpiece.

Aspects of the present disclosure are discussed with reference to a "workpiece" "wafer" or semiconductor wafer for purposes of illustration and discussion. Those of ordinary skill in the art, using the disclosures provided herein, will understand that the example aspects of the present disclosure can be used in association with any semiconductor substrate or other suitable substrate. In addition, the use of the term "about" in conjunction with a numerical value is intended to refer to within twenty percent (20%) of the stated numerical value. A "pedestal" refers to any structure that can be used to support a workpiece.

FIG. 1, for example, illustrates a workpiece that has been treated with a plasma process to provide nitridation on the workpiece. The workpiece 10, may be a silicon workpiece. After exposure to the plasma process, certain nitrogen species 12 have been implanted into the workpiece 10. The workpiece 10 has a nitridation layer 14 extending from the surface of the workpiece 10 into the bulk or body of the workpiece. As shown, the nitridation layer 14 has a particular nitridation depth $N_d$, which generally corresponds to the distance from the surface of the workpiece to the lowest depth at least one of the nitrogen species 12 has descended into the workpiece 10. The workpiece 10 may also have a nitrogen dose, which corresponds to percentage amount of nitrogen that is disposed within the nitridation layer 14 of the workpiece 10. The nitrogen dose may correspond to the atomic percentage of nitrogen within the nitridation layer, i.e. the number of nitrogen atoms with respect to the total number of atoms in the nitridation layer.

Figure 2:
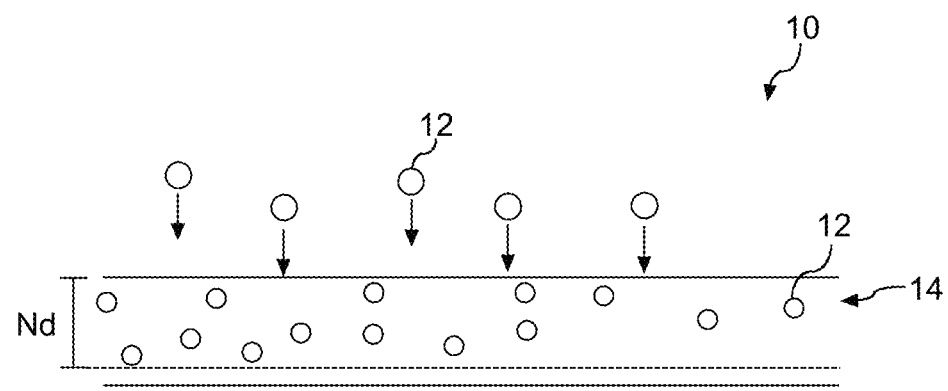
FIG. 2 depicts a workpiece treated according to the methods of the present disclosure.

FIG. 2 illustrates a workpiece that has been treated with a method according to example aspects of the present disclosure to provide nitridation on the workpiece. The workpiece 10 may be a silicon workpiece. Nitrogen species 12 have been implanted into the workpiece 10. The workpiece 10 has as nitridation layer 14 extending from the surface of the workpiece 10 into the bulk or body of the workpiece 10. As shown, the nitridation layer 14 has a particular nitridation depth $N_d$, which generally corresponds to the distance between the surface of the workpiece to the lowest depth at least one of the nitrogen species 12 has descended into the workpiece 10. The workpiece 10 may also have a nitrogen dose, which corresponds to percentage amount of nitrogen that is disposed within the nitridation layer 14 of the workpiece 10. The nitrogen dose may correspond to either a weight percentage amount of nitrogen in the nitridation layer 14 or a volume percentage amount of nitrogen in the nitridation layer 14.

Comparing FIG. 1 to FIG. 2, the methods according to example aspects of the present disclosure can be implemented to provide a nitridation depth $N_d$ that extends deeper or further into the workpiece 10. Also, the workpiece 10 treated according to the method of the present disclosure can have a higher nitrogen dose or a higher nitrogen concentration in the nitridation layer as compared to workpieces treated via other methods. Furthermore, the workpiece 10 experiences less damage, (e.g., reduced workpiece substrate material or film loss), as compared to workpieces that are treated via other plasma based methods.

Figure 3:
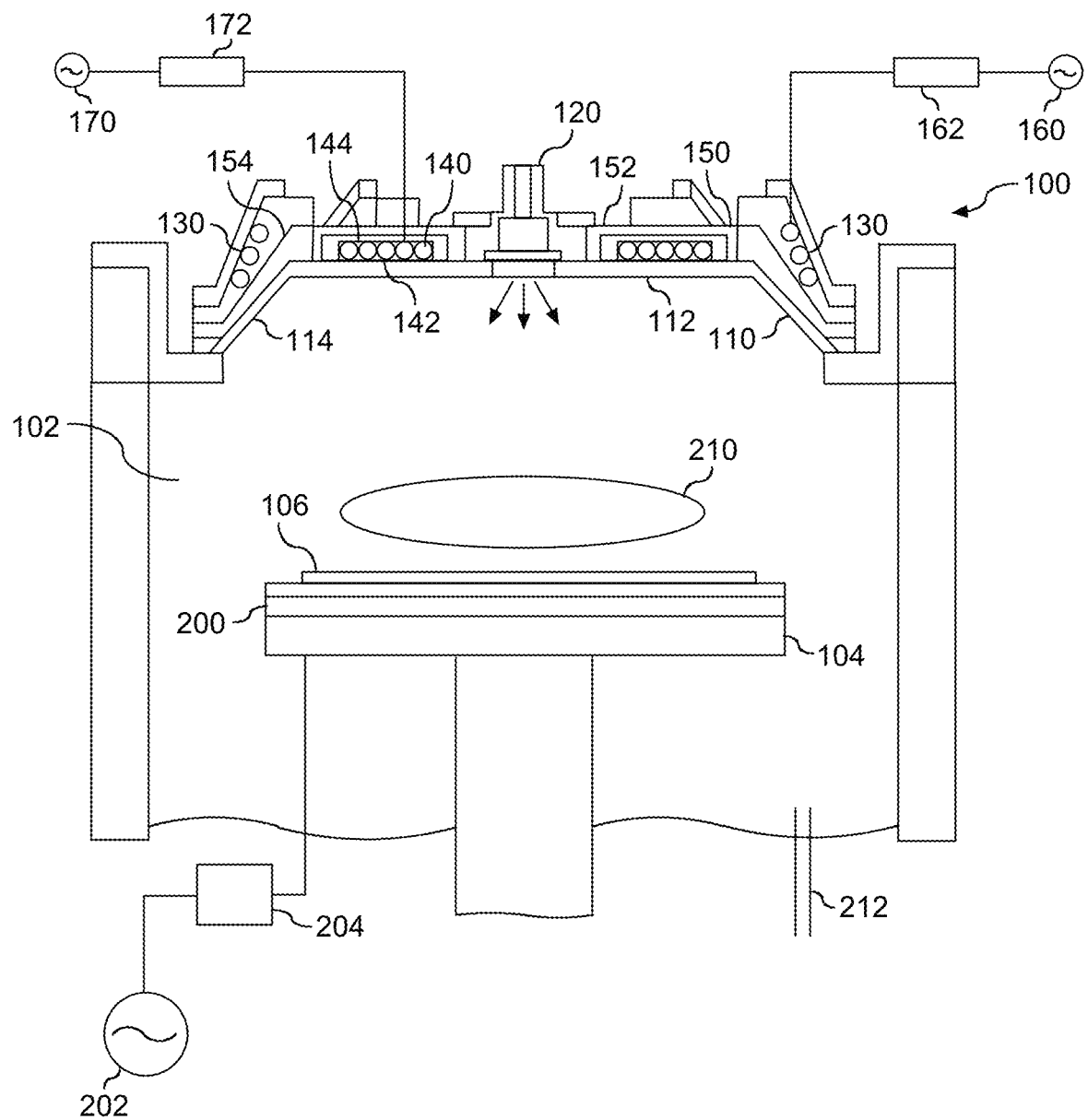
FIG. 3 depicts a plasma processing apparatus according to aspects of the present disclosure.

FIG. 3 depicts an example plasma processing apparatus 100 that can be used to perform processes according to example embodiments of the present disclosure. The plasma processing apparatus 100 includes a processing chamber defining an interior space 102. A pedestal or workpiece support 104 is operable to support a workpiece 106, such as a semiconductor wafer, within the interior space 102. A dielectric window 110 is located above the substrate holder 104. The dielectric window 110 includes a relatively flat central portion 112 and an angled peripheral portion 114. The dielectric window 110 includes a space in the central portion 112 for a showerhead 120 to feed process gas into the interior space 102.

The apparatus 100 further includes a plurality of inductive elements, such as primary inductive element 130 and secondary inductive element 140, for generating an inductive plasma in the interior space 102. The inductive elements 130, 140 can include a coil or antenna element that when supplied with RF power, induces a plasma in the process gas in the interior space 102 of plasma processing apparatus 100. For instance, a first RF generator 160 can be configured to provide electromagnetic energy through a matching network 162 to the primary inductive element 130. A second RF generator 170 can be configured to provide electromagnetic energy through a matching network 172 to the secondary inductive element 140. The second inductive element 140 can include a planar coil 142 and a magnetic flux concentrator 144. The magnetic flux concentrator 144 is made from a ferrite material. Use of a magnetic flux concentrator with a proper coil gives high plasma coupling and good energy transfer efficiency of the secondary inductive element 140, and significantly reduces its coupling to the metal shield 150. Use of a lower frequency, such as about 2 MHz, on the secondary inductive element 140 increases the skin layer, which also improves plasma heating efficiency.

While the present disclosure makes reference to a primary inductive element and a secondary inductive element, those of ordinary skill in the art, should appreciate that the terms primary and secondary are used for convenience purposes only. The secondary inductive element can be operated independent of the primary inductive element, and vice versa.

According to aspects of the present disclosure, the apparatus 100 can include a metal shield portion 152 disposed around the secondary inductive element 140. As discussed in more detail below, metal shield portion 152 separates the primary inductive element 130 and the secondary inductive element 140 to reduce cross-talk between the inductive elements 130, 140. Apparatus 100 can further include a Faraday shield 154 disposed between the primary inductive element 130 and the dielectric window. Faraday shield 154 can be a slotted metal shield that reduces capacitive coupling between the primary inductive element and the process chamber 102. As illustrated, Faraday shield 154 can fit over the angled portion of the dielectric shield 110. The Faraday shield 154 can be electrically grounded.

In a particular embodiment, metal shield 152 and Faraday shield 154 can form a unitary body 150 for ease of manufacturing and other purposes. The multi-turn coil of the primary inductive element 130 can be located adjacent the Faraday shield portion 154 of the unitary body metal shield/Faraday shield 150. The secondary inductive element 140 can be located proximate the metal shield portion 152 of metal shield/Faraday shield unitary body 150, such as between the metal shield portion 152 and the dielectric window 110. When the inductive elements 130 and 140 are energized with RF energy, an inductively coupled plasma can be generated from a mixture in the processing chamber 102 for direct exposure to the workpiece.

In some embodiments, the inductively coupled plasma is generated from a process gas. In some embodiments, the process gas is admitted through the showerhead 120 into the interior space 102. In some embodiments, the process gas used to generate the inductively coupled plasma includes a nitrogen containing gas. In some embodiments, the nitrogen containing gas includes nitrogen ($N_2$), ammonia ($NH_3$), and mixtures thereof. In some embodiments, the process gas may further include on or more diluent gases. The diluent gas may include helium (He), Argon (Ar), hydrogen ($H_2$), and mixtures thereof.

The example plasma processing apparatus of FIG. 3 includes a bias source having a bias electrode 200 in the pedestal 104. The bias electrode 200 can be coupled to an RF power generator 202 via a suitable matching network 204. A DC bias can also be provided to the bias electrode 200. When the bias electrode 200 is energized with RF energy, a capacitively coupled plasma 210 can be generated from a mixture in the processing chamber 102 for direct exposure to the workpiece 106. The processing chamber 102 can include a gas exhaust port 212 for evacuating a gas from the processing chamber 102. The one or more species used in the nitridation process according to example aspects of the present disclosure can be generated using the capacitively coupled plasma. In some embodiments, the capacitively coupled plasma is generated from a process gas. In some embodiments, the process gas is admitted through the showerhead 120 into the interior space 102. In some embodiments, the process gas includes a nitrogen containing gas. In some embodiments, the nitrogen containing gas used to generate the capacitively coupled plasma includes nitrogen ($N_2$), ammonia ($NH_3$), or mixtures thereof. In some embodiments the process gas used for generating the capacitively coupled plasma may be the same process gas that is used to generate the inductively coupled plasma.

FIG. 3 depicts one example plasma processing apparatus for purposes of illustration and discussion. Those of ordinary skill in the art, using the disclosures provided herein, will understand that other plasma processing apparatus capable of providing both an inductively coupled plasma and a capacitively coupled plasma can be used without deviating from the scope of the present disclosure.

Figure 4:
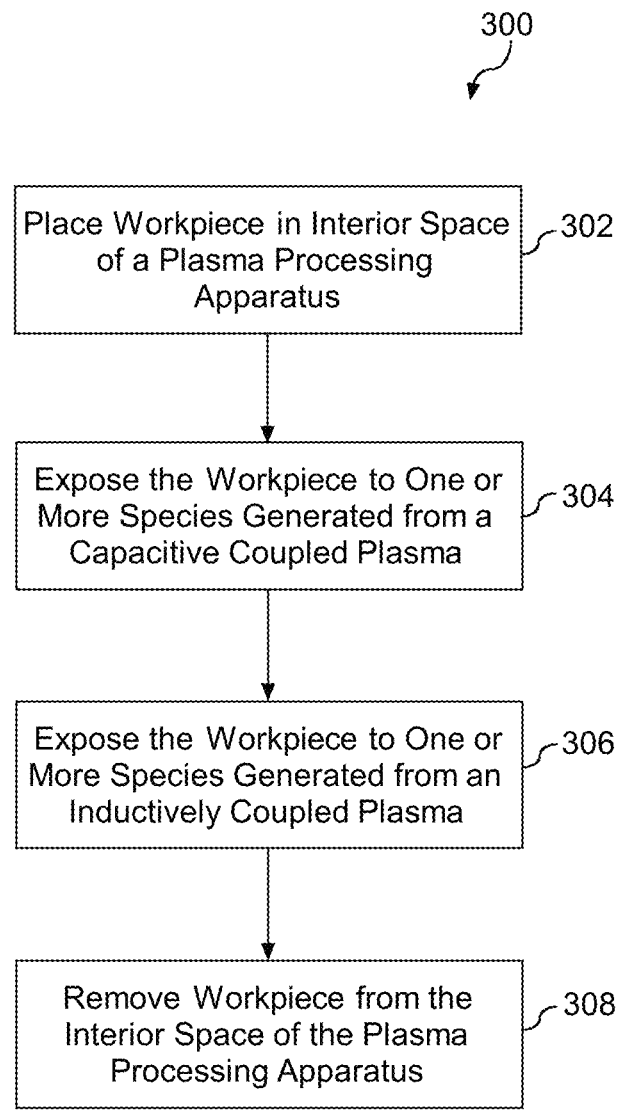
FIG. 4 depicts a flow diagram of an example surface treatment process according to exemplary embodiments of the present disclosure.

FIG. 4 depicts a flow diagram of one example method (300) according to example aspects of the present disclosure. The method (300) will be discussed with reference to the plasma processing apparatus 100 of FIG. 3 by way of example. The method (300) can be implemented in any suitable plasma processing apparatus. FIG. 4 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (302) the method can include placing a workpiece 106 in the interior space 102 of a processing chamber of a plasma processing apparatus 100. The method can include placing a workpiece 106 onto a workpiece support 104 in the processing chamber. In some embodiments, the workpiece 106 includes at least one layer of silicon or is comprised of silicon.

At (304) the method can include exposing the workpiece 106 to one or more species generated using a capacitively coupled plasma to provide nitridation on the workpiece 106. This nitridation process can include admitting a first process gas into the interior space 102. The first process gas may be admitted into the chamber via any suitable gas introduction mechanism. In some embodiments, the process gas is admitted through the showerhead 120 into the interior space 102. In some embodiments, the first process gas comprises a nitrogen containing gas. In some embodiments, the nitrogen containing gas includes nitrogen ($N_2$), ammonia ($NH_3$), or mixtures thereof. In some embodiments, the first process gas may include a diluent gas. In some embodiments, the diluent gas may include helium (He), argon (Ar), hydrogen ($H_2$), and mixtures thereof.

The first process gas is energized via a capacitively coupled plasma source (e.g., a bias electrode disposed in a workpiece support) to generate a plasma in the interior space 102 of the plasma processing apparatus 100. For instance, the bias electrode 200 can be energized with RF energy from RF power generator 202 to generate a plasma in the interior space 102 of the plasma processing apparatus 100. The capacitively coupled plasma generated from the capacitively coupled plasma source contains one or more species, (e.g., ions and/or radicals), that are exposed to the workpiece 106 to provide nitridation on the workpiece. In some embodiments, the capacitively coupled plasma accelerates the ions/radicals in the species or increases the kinetic energy of the ions/radicals in the species towards the workpiece 106, which allows for nitridation of the workpiece 106. A DC bias can be provided to the bias electrode as a process parameter to adjust ion energy.

In some embodiments, the Faraday shield 154 may also work as the grounding electrode (e.g., a grounded electrode) when the plasma processing apparatus is operating to produce a capacitively coupled plasma. The Faraday shield 154 offers a large grounding or grounded electrode surface and may act as the grounded electrode with respect to the workpiece 106 located on the bias electrode 200. The grounding electrode has a surface area that is greater than the surface area of the bias electrode 200, such as at least two times greater than a surface area of the bias electrode 200, such as at least three times as great as a surface area of the bias electrode 200, such as at least five times as great a surface area of the bias electrode 200. This configuration of the grounding electrode in comparison to the bias electrode 200 may induce a higher bias voltage on the wafer side of the workpiece 106 (i.e. the side of the workpiece exposed to the interior space 102 of the chamber and not the side exposed to the workpiece support 104), which leads to higher ion energy. This enables high-dose nitridation on the surface of the workpiece 106.

In some embodiments, after exposure to the one or more species generated from the capacitively coupled plasma, i.e. (304), the workpiece 106 includes a particular nitridation depth $N_d$, which generally corresponds to the distance between the surface of the workpiece to the lowest depth at least one of the nitrogen particles has descended into the workpiece 106. In some embodiments, the nitridation depth, $N_d$, may be from about 5 Å to about 140 Å. In certain embodiments, nitridation processes disclosed herein, may generate a layer of nitrogen on the surface of the workpiece in addition to implanting nitrogen in the workpiece itself. Accordingly, in certain embodiments, the nitridation depth $N_d$ may correspond to the distance between the surface of the added nitrogen layer of the workpiece to the lowest depth at least one of the nitrogen particles has descended into the workpiece 106.

At (306) the method can include exposing the workpiece 106 to one or more species generated using an inductively coupled plasma to provide nitridation on the workpiece 106. This nitridation process can include admitting a second process gas into the interior space 102. The second process gas may be admitted into the chamber via any suitable gas introduction mechanism. In some embodiments, the second process gas is admitted through the showerhead 120 into the interior space 102. In some embodiments, the second process gas comprises a nitrogen containing gas. In some embodiments, the nitrogen containing gas includes nitrogen ($N_2$) or ammonia ($NH_3$). In some embodiments, the second process gas comprises a fluorine containing gas. In some embodiments, the fluorine containing gas includes fluorine ($F_2$), hydrofluoric acid (HF), tetrafluoromethane ($CF_4$), nitrogen trifluoride ($NF_3$), sulfur hexafluoride ($SF_6$), fluoromethane ($CH_3F$), fluoroform ($CHF_3$), difluoromethane ($CH_2F_2$), and combinations or mixtures thereof. Still in certain embodiments, the second process gas may be the same as the first process gas.

The second process gas is energized via an inductively coupled plasma source to generate a plasma in the interior space 102 of the plasma processing apparatus 100. For instance, the inductive element 130 can be energized with RF energy from RF power generator 160 to generate a plasma in the interior space 102 of the plasma processing apparatus 100. The inductively coupled plasma generated from the inductively coupled plasma source contains one or more species, (e.g., ions and/or radicals), that are exposed to the workpiece 106 to provide nitridation on the workpiece. A DC bias can be provided to the bias electrode as a process parameter to adjust ion energy.

In some embodiments, the workpiece 106 is exposed to the one or more species of the inductively coupled plasma after exposure to the one or more species of the capacitively coupled plasma. In still other embodiments, exposure of the workpiece to one or more species generated from a inductively coupled plasma (306) is optional.

In some embodiments, after exposure to the one or more species generated from the inductively coupled plasma, i.e. (306), the workpiece 106 includes a particular nitridation depth $N_d$, which generally corresponds to the distance between the surface of the workpiece to the lowest depth at least one of the nitrogen particles has descended into the workpiece 106. The nitridation depth, $N_d$, may be from about 5 Å to about 140 Å. In certain embodiments, nitridation processes disclosed herein, may generate a layer of nitrogen on the surface of the workpiece in addition to implanting nitrogen in the workpiece itself. Accordingly, in certain embodiments, the nitridation depth $N_d$ may correspond to the distance between the surface of the added nitrogen layer of the workpiece to the lowest depth at least one of the nitrogen particles has descended into the workpiece 106.

In certain embodiments the workpiece may be exposed to one or more species generated from an inductively coupled plasma (306) in order to increase the nitridation depth ($N_d$) of the workpiece or to increase the nitrogen concentration or nitrogen dose in the nitridation layer 14 of the workpiece 106. In some embodiments, exposing the workpiece to the capacitively coupled plasma (304) and then exposing the workpiece to the inductively coupled plasma (306) may increase the nitridation depth ($N_d$) of the workpiece 106 at least 25% as compared to exposure to capacitively coupled plasma (304) only.

At (308) the method can include removing the workpiece 106 from the processing chamber. For instance, the workpiece 106 can be removed from workpiece support 104 in the interior space 102 of the plasma processing apparatus 100. The plasma processing apparatus can then be conditioned for future processing of additional workpieces.

Figure 5:
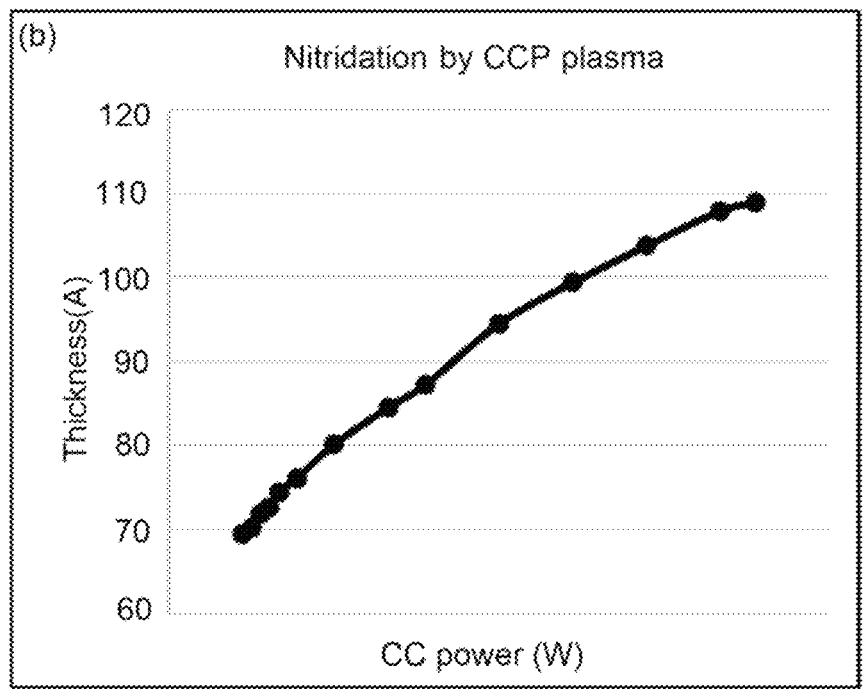
FIG. 5 depicts the thickness of a nitridation layer (A) as compared to CCP power.

Example process parameters associated with exposing the workpiece to a capacitively coupled plasma are set forth below:
  Process Gas: $N_2$, $N_2/He$, $N_2/Ar$, $N_2/H_2$ or $NH_3$
  Workpiece Temperature: 20° C. to 150° C.
  Pressure: 3 mT to 1000 mT
  Bias Power: 50 Wb to 3000 Wb
  Process Period: 30 sec to 900 sec
  Gas Flow Rates: 20 sccm to 2000 sccm Example process parameters associated with exposing the workpiece to an inductively coupled plasma are set forth below:
  Process Gas: $N_2$, $N_2/He$, $N_2/Ar$, $N_2/H_2$ or $NH_3$
  Workpiece Temperature: 20° C.-50° C.
  Pressure: 3 mT to 1000 mT
  ICP Source Power: 500 W to 2500 W
  Process Period: 30 sec to 900 sec
  Gas Flow Rates: 20 sccm to 2000 sccm FIG. 5 depicts example results of a nitridation process using a capacitively coupled plasma. FIG. 5 plots capacitively coupled plasma source (bias electrode) power on the horizontal axis and thickness (in Angstroms) on the vertical axis. As shown in FIG. 5, the nitridation layer thickness on a workpiece may increase with the power of the capacitively coupled plasma.

Figure 6A:
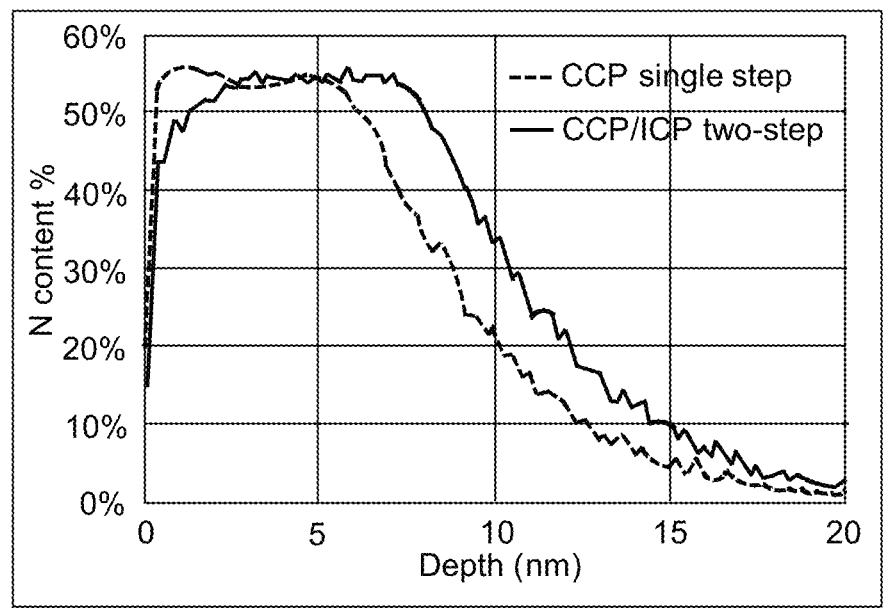
FIG. 6A depicts the percent nitrogen and depth of nitrogen of a workpiece exposed to a single-step CCP method and a workpiece exposed to a two-step, CCP followed by ICP, method.

FIG. 6A depicts example results of a nitridation process using a capacitively coupled plasma and a nitridation using both capacitively coupled plasma and inductively coupled plasma. FIG. 6A plots the depth (in Angstroms) on the horizontal axis and the nitrogen percentage on the vertical axis. As shown in FIG. 6A the workpiece subjected to the two-step, capacitively coupled plasma and inductively coupled plasma process, has a higher nitrogen content and a greater depth as compared to a workpiece that was subjected to the capacitively coupled plasma process only. Accordingly, without being bound by any particular theory, in some embodiments, the workpiece may first be exposed to a capacitively coupled plasma process and then, subsequently to an inductively coupled plasma process in order to increase both the nitrogen content and depth of the nitridation layer on the workpiece.

Figure 6B:
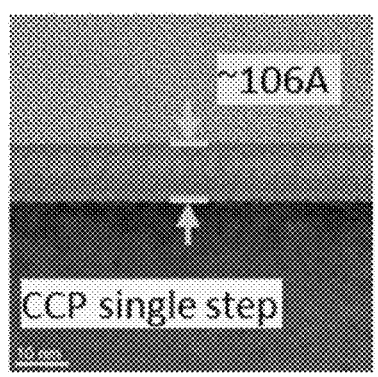
FIG. 6B depicts a transmission electron microscopy image of a workpiece exposed to a CCP nitridation method.
Figure 6C:
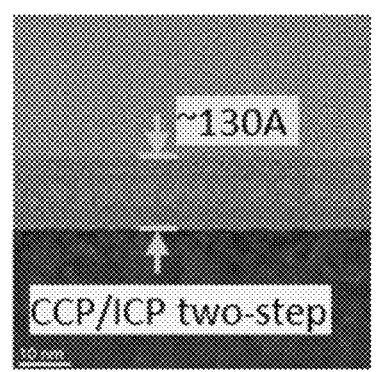
FIG. 6C depicts a transmission electron microscopy image of a workpiece exposed to a CCP nitridation method followed by an ICP nitridation method.

FIG. 6B illustrates a transmission electron microscopy image of a workpiece exposed to the single-step capacitively coupled plasma method. As shown, the workpiece has a nitrogen depth of about 106 Å. FIG. 6C illustrates a transmission electron microscopy image of a workpiece exposed to a capacitively coupled plasma method and an inductively coupled plasma method. As shown, the workpiece has a nitrogen depth of about 130 Å. The total thickness of the nitridation depth or nitridation layer resulting from the two-step process (CCP+ICP) is more than 20% higher than the single-step (CCP) process.

Figure 7:
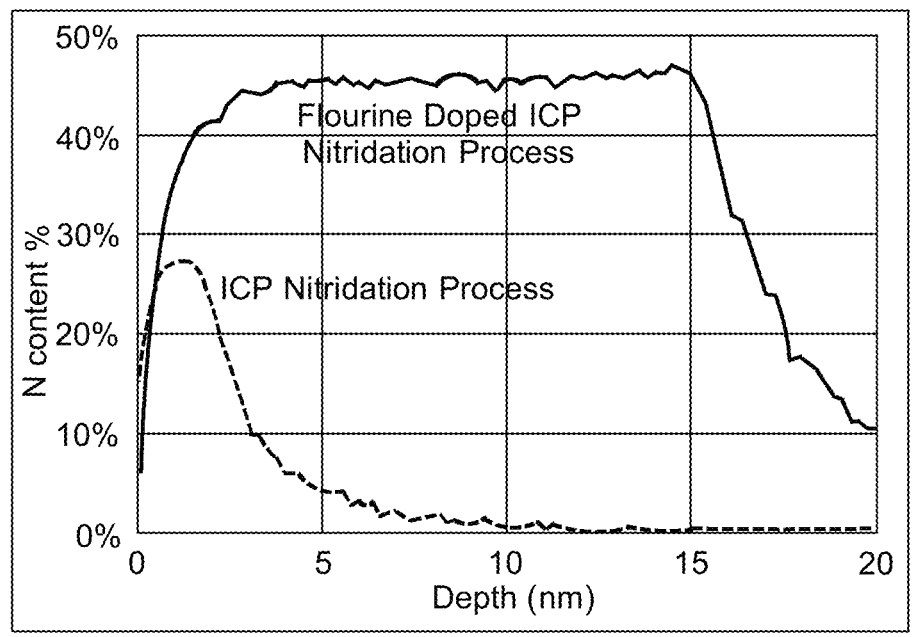
FIG. 7 depicts the nitrogen percentage and nitrogen depth of a workpiece exposed to a fluorine-containing ICP nitridation process.

FIG. 7 depicts example results of a nitridation using a fluorine doped inductively coupled plasma process and using an inductively coupled plasma process without fluorine. FIG. 7 plots the depth (in nanometers) of the nitridation on the horizontal axis and the nitrogen percentage on the vertical axis. As shown, the inclusion of fluorine during the ICP process significantly increases the concentration and depth of nitrogen in the substrate.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A method of processing a workpiece in a plasma processing apparatus, the plasma processing apparatus comprising a processing chamber having an interior operable to receive a process gas and a workpiece support operable to support a workpiece, the method comprising:
  placing the workpiece on the workpiece support in the processing chamber;
  generating one or more species using a capacitively coupled plasma induced from a first process gas using a capacitively coupled plasma source;
  exposing the workpiece to the one or more species generated using the capacitively coupled plasma from the first process gas to provide nitridation on the workpiece,
  generating one or more species using an inductively coupled plasma induced from a second process gas using an inductively coupled plasma source; and
  exposing the workpiece to the one or more species generated using the inductively coupled plasma from the second process gas to increase a nitridation depth on the workpiece.

2. The method of claim 1, wherein the first process gas comprises a nitrogen containing gas.

3. The method of claim 2, wherein the nitrogen containing gas comprises $N_2$, $NH_3$, or combinations thereof.

4. The method of claim 1, wherein the second process gas comprises a nitrogen containing gas.

5. The method of claim 4, wherein the nitrogen containing gas comprises $N_2$, $NH_3$, or combinations thereof.

6. The method of claim 1, wherein the second process gas comprises a fluorine containing gas.

7. The method of claim 6, wherein the fluorine containing gas comprises $CF_4$, $NF_3$, $CH_3F$, or mixtures thereof.

8. The method of claim 1, wherein the nitridation depth is from about 5 Å to about 140 Å.

9. The method of claim 1, wherein the plasma processing apparatus comprises a grounded electrode disposed between the inductively coupled plasma source and the interior of the processing chamber, wherein the capacitively coupled plasma source comprises a RF bias electrode, wherein the grounded electrode has a surface area that is greater than a surface area of the RF bias electrode.

10. The method of claim 9, wherein the grounded electrode has a surface area that is at least two times greater than the surface area of the RF bias electrode.

11. The method of claim 1, wherein the workpiece comprises at least one layer of silicon.

12. A method of processing a workpiece in a plasma processing apparatus, the plasma processing apparatus comprising a processing chamber having an interior operable to receive a process gas, a workpiece support operable to support a workpiece, at least one first plasma source disposed over the process chamber interior, and a second plasma source comprising a bias source coupled to a bias electrode in the workpiece support the method comprising:
  placing a workpiece on the workpiece support within the interior of the processing chamber of the processing apparatus;
  admitting a first process gas into the interior of the processing chamber;
  energizing the bias source to generate one or more species from a first process gas in the interior of the processing chamber;
  exposing the workpiece to the one or more species to provide a nitridation depth on the workpiece;
  admitting a second process gas into the interior of the processing chamber;
  energizing the first plasma source to generate one or more species from the second process gas in the interior of the processing chamber; and
  exposing the workpiece to the one or more species to increase the nitridation depth on the workpiece.

13. The method of claim 12, wherein energizing the bias source to generate one or more species in the interior of the processing chamber occurs before energizing the first plasma source to generate one or more species in the interior of the processing chamber.

14. The method of claim 12, wherein the first process gas comprises a nitrogen containing gas.

15. The method of claim 12, wherein the second process gas comprises a nitrogen containing gas.

16. The method of claim 12, wherein the second process gas comprises a fluorine containing gas.

17. The method of claim 12, wherein the nitridation depth is from about 5 Å to about 140 Å.

18. The method of claim 12, wherein the plasma processing apparatus comprises a grounded electrode disposed between the first plasma source and the interior of the processing chamber, wherein the grounded electrode has a surface area that is greater than a surface area of the bias electrode.

* * * * *